United States Patent [19]

Quan et al.

[11] Patent Number: 5,095,279
[45] Date of Patent: Mar. 10, 1992

[54] VARIABLE FREQUENCY SINE WAVE CARRIER SIGNAL GENERATOR

[75] Inventors: Ronald Quan, Cupertino; Ali R. Hakimi, San Jose, both of Calif.

[73] Assignee: Macrovision Corporation, Mountain View, Calif.

[21] Appl. No.: 602,604

[22] Filed: Oct. 24, 1990

Related U.S. Application Data

[62] Division of Ser. No. 514,891, Apr. 26, 1990.

[51] Int. Cl.⁵ .................. H03B 19/00; H03B 28/00
[52] U.S. Cl. ......................... 328/14; 328/27; 377/42; 307/271
[58] Field of Search .............. 377/42; 328/14, 27; 307/271

[56] References Cited

U.S. PATENT DOCUMENTS

| | | | |
|---|---|---|---|
| 3,657,657 | 4/1972 | Jefferson | 328/14 |
| 3,735,269 | 5/1973 | Jackson | 328/14 |
| 4,039,806 | 8/1977 | Fredriksson et al. | 328/14 |
| 4,484,296 | 11/1984 | Treise et al. | 328/14 |
| 4,727,570 | 2/1988 | Tarbouriech | 328/27 |
| 4,748,640 | 5/1988 | Staley et al. | 328/14 |
| 4,943,779 | 7/1990 | Pedersen et al. | 328/14 |

Primary Examiner—John S. Heyman
Attorney, Agent, or Firm—Skjerven, Morrill, MacPherson, Franklin & Friel

[57] ABSTRACT

A system and method for generating a variable frequency sine wave carrier signal operates in response to a start signal and a rate signal. The system includes a first counter which drives a second counter via an EPROM; the second counter is clocked by the output of an oscillator. The output of the second counter is converted by filtering to the desired sine wave signal.

11 Claims, 8 Drawing Sheets

VARIABLE FREQUENCY SINE WAVE CARRIER SIGNAL GENERATOR

This application is a division of application Ser. No. 514,891, filed 4/26/90.

BACKGROUND OF THE INVENTION

This invention relates to a system and method for generating a variable frequency sine wave carrier signal. The invention is particularly applicable as a part of a system using an in-band carrier for frequency shifting techniques for scrambling and descrambling of audio signals.

The invention comprises a system for generating the variable frequency sine wave carrier signal in response to a start signal and a rate signal, the carrier signal having frequencies lying within a predetermined spectral frequency limit, and the system including first settable counter means having a clock input for receiving a first clock signal, a count input for receiving modulus value signals for establishing the counter modulus N, and an output terminal for manifesting a binary output signal having a frequency determined by the modulus N and the first clock signal; modulus generating means having a control input for receiving the start signal, a clock input for receiving a second clock signal, and an output coupled to the count input of the first settable counter means for generating a succession of modulus values in response to receipt of a start signal and the second clock signal; and means having an input coupled to the output terminal of the first settable counter means for converting the binary output signals therefrom to analog sine signals of variable frequency.

The modulus generating means preferably includes a second counter means having an input serving the clock input of the modulus generating means and an output, and memory means for storing the modulus values, the memory means having address inputs coupled to the output of the second counter means. The memory means includes a first memory device for storing a first plurality of modulus determining values, a second memory device for storing a second plurality of modulus determining values, and processing means for receiving modulus determining values from the first and second memory devices for generating the modulus value signals for the first settable counter means.

The system further includes a second clock generating means, the second clock generating means including an oscillator and a second settable counter means having a clock input coupled to the oscillator, a count input terminal means for receiving the rate signal, and an output terminal means coupled to the clock input of the modulus generating means, the output of the second settable counter means having a frequency determined by the value of the rate signal. The rate signal may be either periodic, or non-periodic: if non-periodic, the rate signal is preferably pseudo random.

The converting means preferably includes a first low pass filter means for smoothing the binary output signals from the first settable counter means; means for generating a sine wave signal having a frequency different from the frequency of the signals output from the first low pass filter means; mixer means having a first input coupled to the output of the first low pass filter means, a second input coupled to the output of the sine wave signal generating means, and an output; and second low pass filter means having an input coupled to the output of the mixer means and an output for passing signals having frequencies lying within the predetermined spectral frequency limit.

For a fuller understanding of the nature and advantages of the invention, references should be had to the ensuing detailed description taken in conjunction with the accompanying drawings.

DESCRIPTION OF THE PREFERRED EMBODIMENT

Figure 1A:
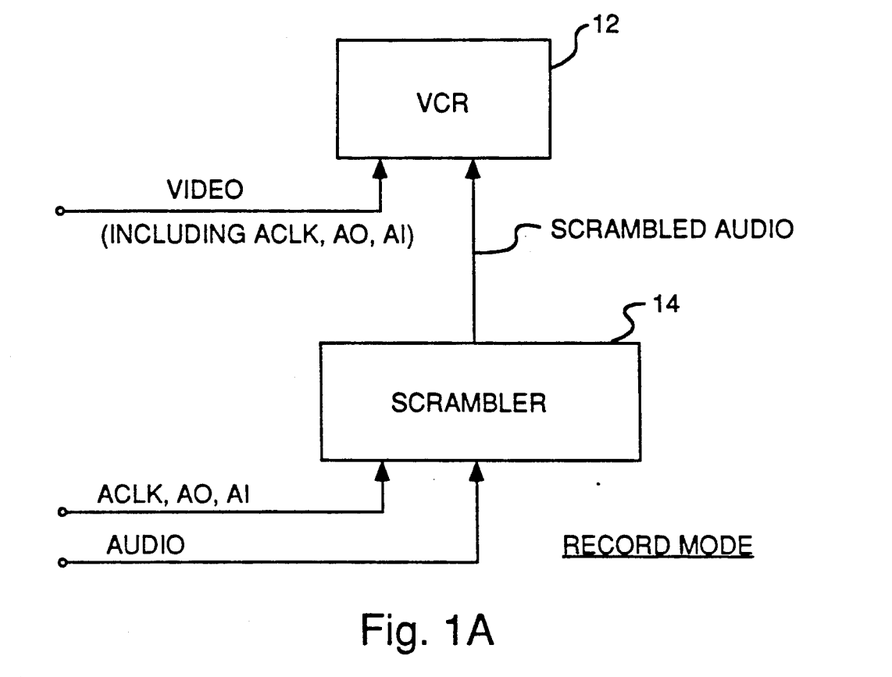
FIG. 1A is a block diagram illustrating scrambling of the audio portion of composite video signals.

The following description is of the entire scrambling and descrambling apparatus. The claims of this disclosure are directed to the modulation carrier signal generator shown in FIGS. 5 to 8, 10, and 12 and discussed below in connection with these figures. Turning now to the drawings, FIG. 1A illustrates use of the invention to scramble the audio portion of video program signals prior to recording both the video and audio portions onto a video cassette. As seen in this FIG., the video program information signals, including coded control signals termed ACLK, A0, and A1 (described below) are coupled directly to the video input of a conventional video cassette recorder 12. The audio portion, on the other hand, is coupled to the audio input of the scrambler unit 14 in which the audio signals are scrambled in the manner described below.

Figure 1B:
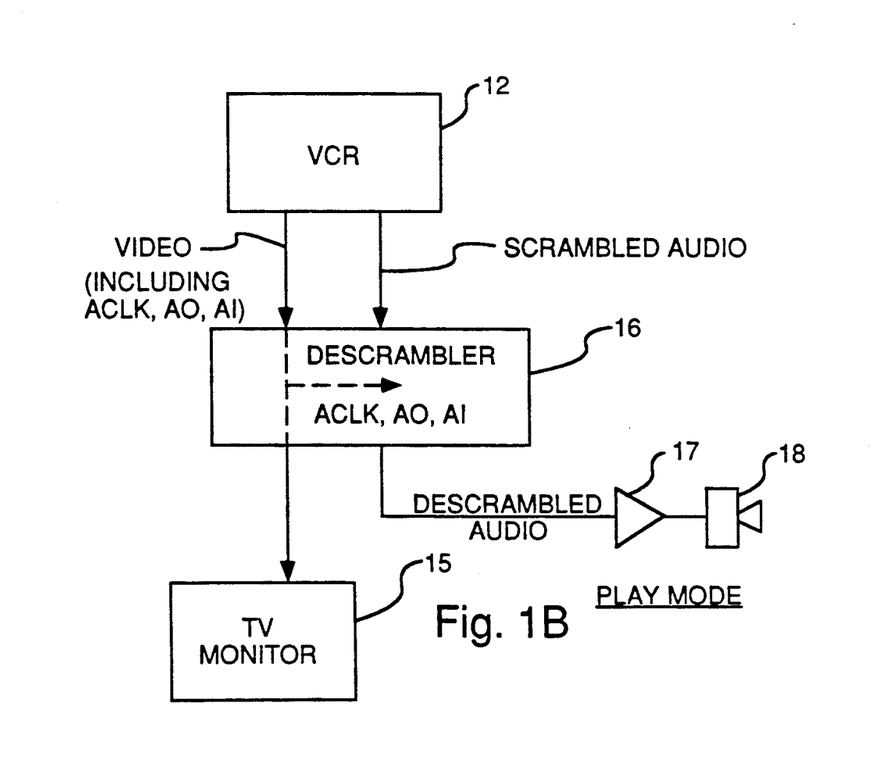
FIG. 1B is a block diagram illustrating descrambling of previously scrambled signals.

The control signals ACLK, A0 and A1 are also coupled to a control input portion of scrambler unit 14. The scrambled audio output signals from scrambling unit 14 are then coupled to the audio input terminal of video cassette recorder unit 12. FIG. 1B illustrates the playback mode for the video and scrambled audio signals prepared in the FIG. 1A system. As seen in FIG. 1B, the video program information appearing at the video output terminal of the VCR unit 12 is coupled directly through a descrambler unit 16 to the associated follow-on electronics (i.e., the television monitor 15). The scrambled audio signals, in contrast, are coupled to the input of the descrambler unit 16. Also, as suggested by the broken line and legends within unit 16, the ACLK, A0 and A1 signal portions of the video output from VCR unit 12 are separated and coupled to the control input portion of descrambler unit 16 for descrambling in the manner described below. The output from the descrambler unit 16 is the audio program portion, now unscrambled, which is amplified by amplifier 17 and coupled to speaker 18.

The scrambling technique employed in the preferred embodiment of the invention is frequency shifting the original audio information signals by upper single side band frequency translation; the descrambling technique employed is lower single side band frequency translation to restore the original audio band frequencies. With reference to the scrambling technique, the original audio information signals are processed by single side band modulation using a modulation carrier having a frequency lying within the original audio information signal band so that all portions of the original audio information signals are shifted up by an amount dependent upon the frequency of the modulation carrier. In addition, the frequency of the modulation carrier signal is varied in a unique manner so that the absolute value of a given frequency in the original audio information signal spectrum changes during scrambling in an unpredictable manner. As a result, the scrambled audio signals, if applied to conventional audio processing circuitry of a receiver/monitor, are so garbled as to be unusable.

The aperiodic variation of the modulation carrier frequency is initiated by an aperiodic timing signal ACLK, which is generated in a pseudo random fashion and which initiates a monotonic sweeping of the modulation carrier from a starting frequency to an ending frequency. The rate at which the frequency is varied is determined by the A0 and A1 binary rate control signals, which are generated in accordance with any suitable scrambling scheme. Thus, the ACLK signal controls the start of the modulation carrier frequency variation, while A0 and A1 control the rate of change of the modulation carrier frequency. The ACLK, A0 and A1 signals are encoded in the vertical interval of the video frames and recorded along with the scrambled audio signals for later reproduction and use during the descrambling operation.

Figure 2:
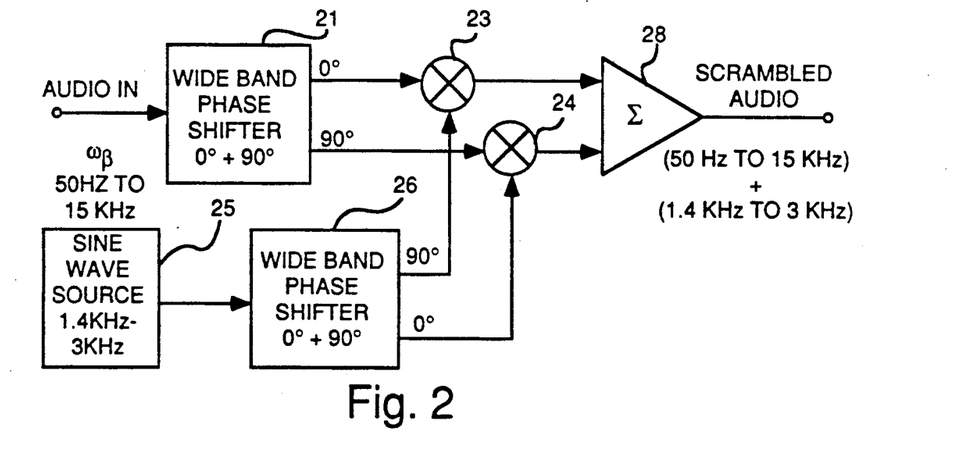
FIG. 2 is a schematic diagram illustrating the modulation circuitry for scrambling the original audio signals.
Figure 9:
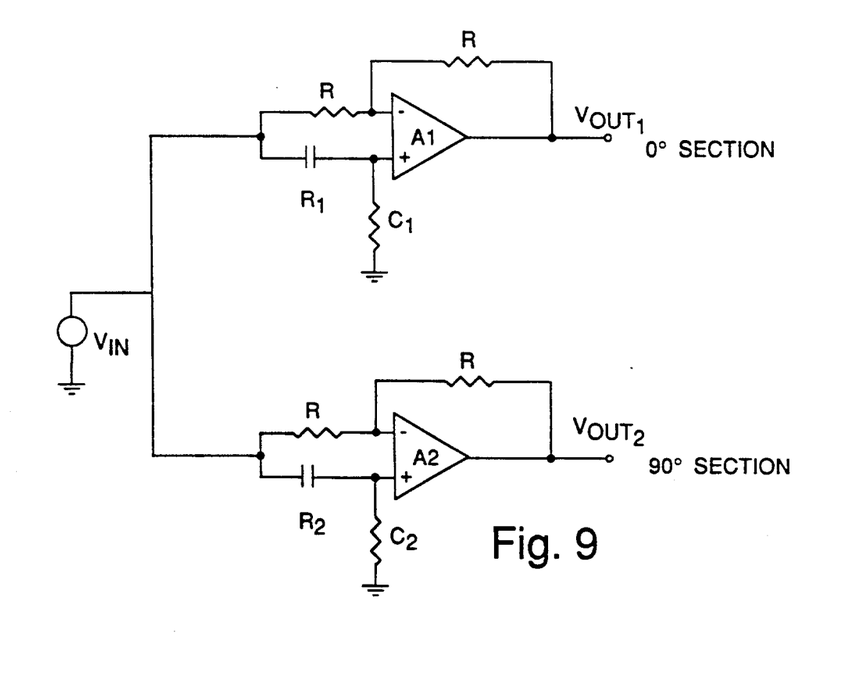
FIG. 9 is a circuit diagram of a single stage of the wide band phase shifter used in the modulation circuitry of FIG. 2.

FIG. 2 illustrates that portion of the scrambler unit 14 of FIG. 1A in which the original audio frequency signals are shifted upwards in frequency by single side band modulation using a modulation carrier signal having a frequency lying within the original audio signal frequency spectrum. As seen in this FIG., the original audio program information signals having frequencies $\omega b$ ($=2\pi f$) lying within a typical audio frequency spectrum of 50 Hz to 15 KHz are coupled to the input of a first wide band phase shifter 21 which provides as output signals the original input signals and a phase shifted version of the original input signals, with the phase difference being a constant 90°. The 0° output from phase shifter 21 is coupled as a first input to a first double side band mixer 23, while the 90° phase shifted version of the original input signals is coupled as a first input of a second double side band mixer 24. A modulation carrier signal source 25 preferably of the type illustrated in FIGS. 5–8, 10 and 11 generate a modulation carrier signal of frequencies $\omega c$ lying in the range (in the preferred embodiment) from about 1.4 KHz to about 3 KHz. The modulation carrier signal output from source 25 is coupled to a second wide band phase shifter 26 identical to wide band phase shifter 21, the first stage of which is illustrated in FIG. 9. The 0° output from wide band phase shifter 26 is coupled as the second input of double side band mixer 24, while the 90° version of the modulation carrier signal from wide band phase shifter 26 is coupled as the second input to double side band mixer 23. The modulation product outputs from mixers 23, 24 are coupled through a summing amplifier 28, the output of which comprises the scrambled version of the original audio input signals, which are coupled to the VCR unit 12 shown in FIG. 1A. The double side band mixers 23, 24 preferably have the configuration shown in FIG. 11.

Figure 3A:
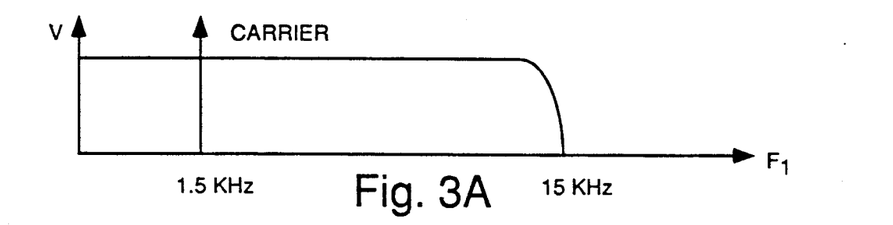
FIG. 3A is a frequency spectrum diagram illustrating the relationship between the modulation carrier and the original audio pass band.

Since the output of mixer 23 is [sin $\omega bt$] ×[cos $\omega ct$], and the output of mixer 24 is [cos $\omega bt$]×[sin $\omega ct$], where $\omega b$ are the frequencies in the original audio band and $\omega c$ are the carrier frequencies, the output of summing amplifier 28 is the sum of the two product terms which simply equals sin [$\omega b + \omega c$]t. It should be noted that the use of two double side band mixers to generate the upper side band frequency translation is necessary due to the fact that the modulation carrier frequency lies within the audio pass band. This is illustrated in FIG. 3A, which is a plot of signal amplitude v versus frequency f for the audio pass band showing the cut-off at about 15K Hz and a single carrier frequency of about 1.5 KHz. If only one double side band mixer were used, the lower side band would interfere with the upper side band because the difference frequency (i.e., the lower side band) is beat by a frequency lower than the upper end of the audio band. This mixing produce lower side band frequencies from D.C. to 13.5 KHz. Thus, from 1.5 KHz to 13.5 KHz both the upper and lower side bands mix, and this normally adverse effect is avoided by the use of the two double side band mixers 23, 24.

Figure 3B:
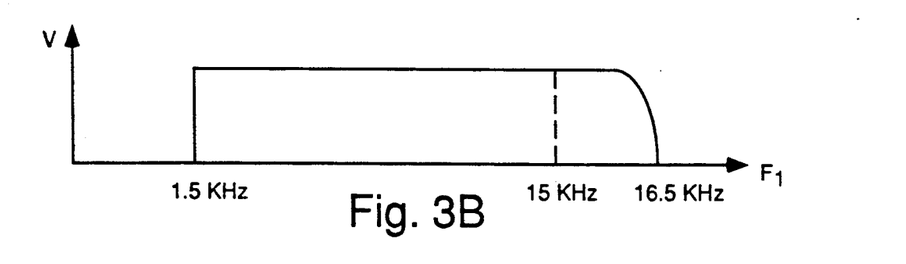
FIG. 3B is a diagram similar to FIG. 3A illustrating the frequency translation effected according to the invention.

FIG. 3B illustrates the translation effect on the original audio program frequencies of the modulation circuitry of FIG. 2. The original audio signals have been translated upperwardly by an amount equal to the carrier frequency (i.e., the entire spectrum has been shifted upward by an amount $\omega c$). As will be understood by those skilled in the art, if $\omega c$ varies in value with time, the real time effect of the modulation is an upward shift from base band by an amount equal to the instantaneous value of $\omega c$.

Figure 4:
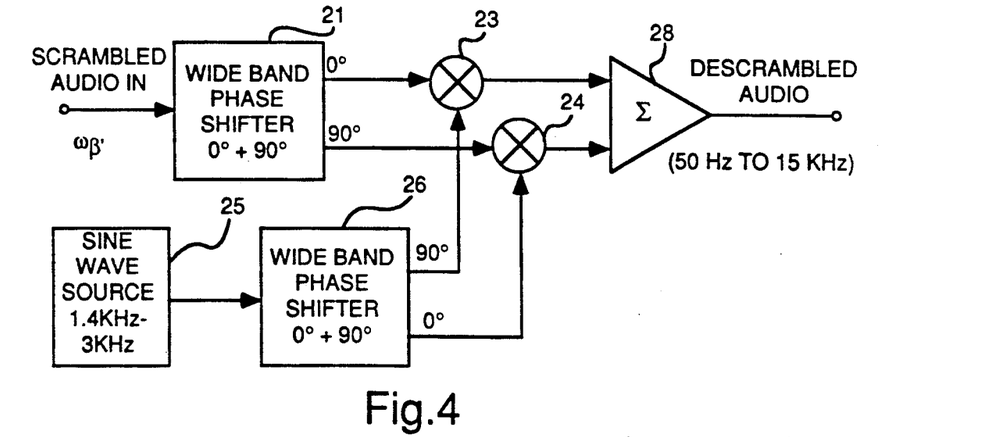
FIG. 4 is a schematic diagram illustrating the demodulation circuitry for descrambling the scrambled audio signals.

FIG. 4 illustrates the demodulation circuitry used in the descrambler unit 16 of FIG. 1B. As seen in FIG. 4, descrambling of the scrambled audio supplied from the VCR 12 at frequency $\omega b'$ is accomplished by essentially identical circuitry configured as a lower single side band mixer. In particular, the 0° output from the second wide band phase shifter 26 is coupled as the second input of double side band mixer 23, while the 90° output from second wide band phase shifter 26 is coupled as the second input of double side band mixer 24 (compare FIG. 2 in which the outputs of the second wide band phase shifter 26 are coupled in reverse order to mixers 23, 24). The output of summing amplifier 28 in the descrambler unit of FIG. 4 is [sin $\omega b't$]×[sin $\omega ct$]+[cos $\omega b't$]×[cos $\omega ct$]=cos [$\omega b' - \omega c$]t where $\omega b' = \omega b + \omega c$. Thus, the output=cos [$\omega b + \omega c - \omega c$]t =cos $\omega bt$. The use of a single side band mixer is essential for descrambling the scrambled audio information. If a mixer, such as a double side band mixer, is used, the descrambled audio would result in large amounts of distortion due to the fact that the lower and upper side bands interfere within the audio base band spectrum. Only the use of a single side band mixer will yield an undistorted descrambled output.

It should further be noted that the modulation and demodulation carrier signals should be as close as possible to constant amplitude pure sine wave sources. If either carrier is not a pure sine wave, intermodulation distortion will occur during descrambling. For example, assume that the carrier $\omega c$ is 1 KHz with 10% third harmonic distortion at 3 KHz. If the audio program signal has a frequency of 500 Hz, then the output of the scrambler 14 will be 1500 Hz (1 KHz+500 Hz) and 3500 Hz (3 KHz+500 Hz). In this example, even if the descrambling modulation frequency is a pure sine wave at 1 KHz, the descrambled tones will be 1500 Hz-1 KHz =500 Hz and 3500 Hz-1 KHz=2500 Hz, the latter comprising an undesired distortion product. This distortion is exacerbated if the descrambling modulation carrier is the same as the scrambling modulation carrier, since the descrambled output from summing amplifier 28 will now be 1500 Hz-1 KHz, 1500 Hz-3 KHz, 3500 Hz-1 KHz, and 3500 Hz-3 KHz, which yields 500 Hz, 1500 Hz, 2500 Hz, and 500 Hz. In this case, the signals at 1500 Hz and 2500 Hz are the extraneous distortion products. As a guideline, for purposes of this invention a pure sine wave is defined as one having less than 0.1% harmonic distortion (i.e., second or higher order harmonic components of amplitude less than 0.1% of the carrier frequency). In addition, the amplitude of the modulation carrier signal should be substantially constant.

The improvement afforded by the simple translation modulation system described above over an inverted side band modulation system may now be explored. For the system described above, and assuming a modulation carrier frequency of 500 Hz and an audio signal of 700 Hz, the output of the scrambler unit 14 (FIG. 1A) will be 500 Hz+700 Hz=1200 Hz. If this signal is recorded on a VCR which has ±1% variation, the playback signal will be 1200 Hz±1%=1200 Hz±12 Hz. The descrambled output will then be 1200 Hz±12 Hz-500 Hz=700 Hz±12 Hz=700 Hz±1.7%.

With an inverted side band system operating on an audio pass band having a 15 KHz bandwidth, the carrier frequency must be at least 16 KHz to be marginally outside the upper bandwidth. For the same audio signal as in the example noted above, the scrambled output would be 1600 Hz-700 Hz=15.3 KHz. When recorded and played back on the same VCR with a ±1% speed variation, the scrambled tone during playback is 15.3 KHz±1%=15.3 KHz±153 Hz. The corresponding descrambled output is 1600 KHz-15.3 KHz±153 Hz=700 Hz±153 Hz=700 Hz±21.9%. The improvement in the frequency variation distortion performance afforded by the invention is apparent.

The harmonic distortion performance is also enhanced according to the invention over the inverted side band system due to the high frequency head room crashing frequently encountered in the inverted side band system. In particular, the signal level of an audio signal to be broadcast or recorded is typically pre-emphasized prior to recording or broadcasting beyond about 2000 Hz in the amount of about 6 db per octave. As a consequence, at 15 KHz the maximum permissible level of a input signal into a broadcast system is about −17 db. Similar performance is obtained with analog tape recorders. With an inverted side band system, the frequency spectrum of the original signals is inverted: i.e., those frequency portions originally lying at the lower end of the audio frequency band are shifted to the upper end while those portions originally lying at the upper end of the band are shifted to the lower end. With such a system, since most of the energy is at about 15 KHz, the inverted side band method only allows about −17 db of input over the entire audio bandwidth into a broadcast system. With the frequency translation technique according to the invention, however, the maximum input level is still about 0 db (i.e., the same level as that in a system without inversion), since the translated spectrum is almost identical with the spectrum of the base band. For example, for voice frequencies (typically in the range from 300 Hz-3 KHz), a frequency translation of 1 KHz according to the invention yields a spectrum of 1300 Hz to 4 KHz, while the prior art frequency inversion technique yields a spectrum of 14.7 KHz to 12 KHz. Thus, using the prior art inverted side band technique, with a broadcast or analog tape deck system the input will have to be at −17 db whereas with the translation system according to the invention the input can be at −6 db. Consequently, the translation system according to the invention improves the signal-to-noise ratio by as much as 11 db.

Figure 5:
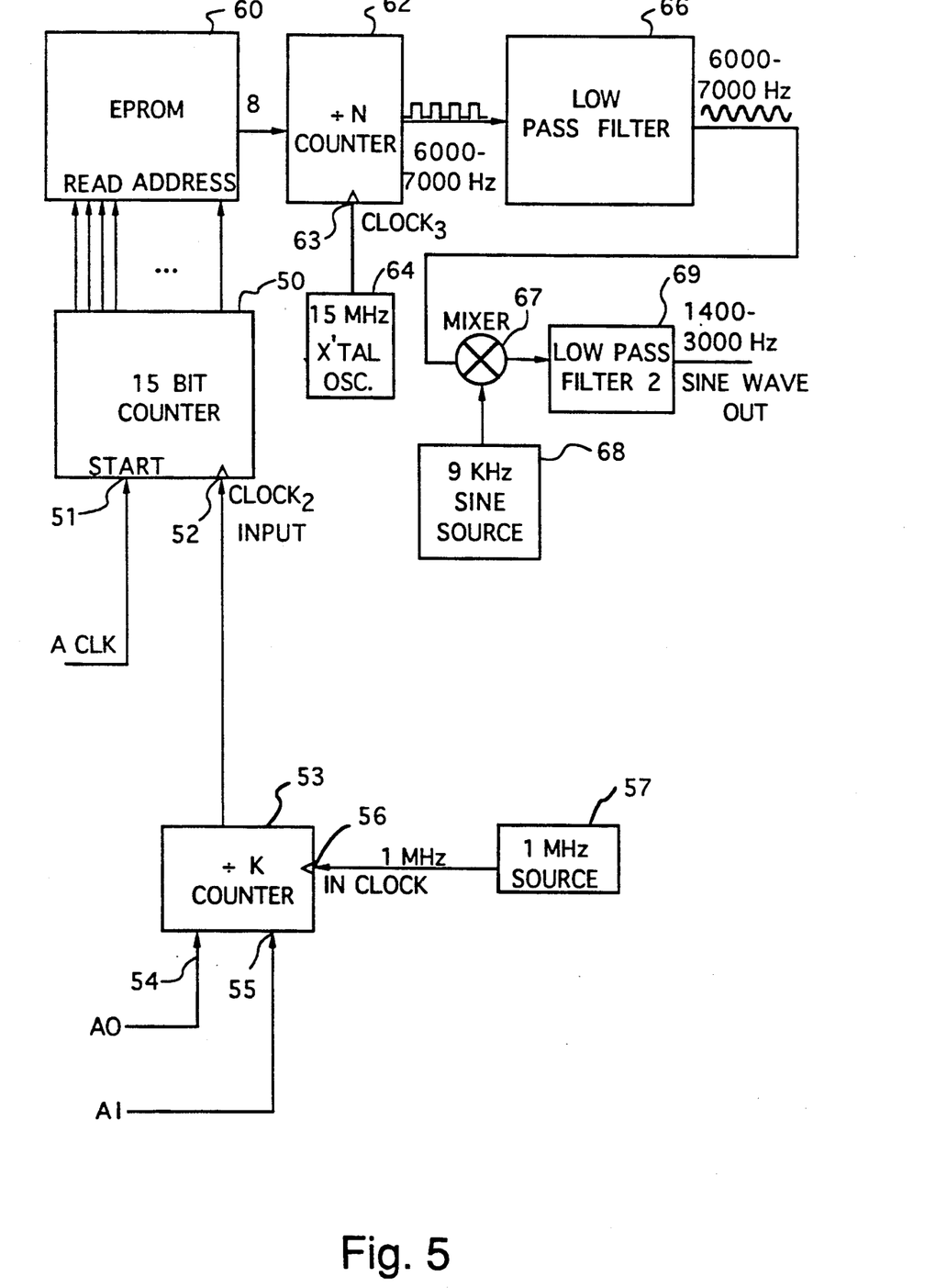
FIG. 5 is a schematic diagram illustrating the modulation carrier signal generator used in the scrambling/descrambling units.
Figure 10:
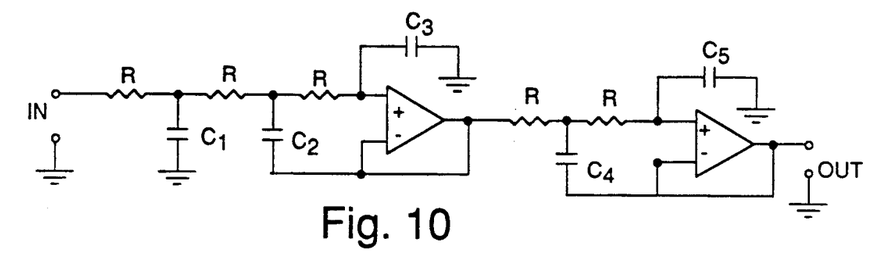
FIG. 10 is a circuit diagram illustrating the low pass filters used in the generator of FIG. 5.

As noted above, the reason for scrambling the audio signals is to limit enjoyment of the program information represented by the audio signals to authorized subscribers. The security of the simple translation system just described is greatly enhanced by varying the frequency of the modulation carrier signal. FIGS. 5-8, 10 and 11 illustrate the preferred embodiment for accomplishing pseudo random carrier frequency variation according to the invention in both the scrambler unit 14 and the descrambler unit 16. With reference to FIG. 5, a 15 bit counter 50 has a start input terminal 51 to which the ACLK control signal is coupled and a clock input terminal 52 to which the counter clock is supplied. The counter clock is supplied from a counter 53 termed the ÷K counter having a pair of preset inputs 54, 55 to which the A0, A1 rate control signals are supplied. The clock input terminal 56 of counter 53 is supplied with a 1 MHz clock signal from a source 57. The state outputs of 15 bit counter 50 are coupled as address inputs to an EPROM memory unit 60. Counter 50 is configured to continuously count down after starting from a maximum value to a minimum value, automatically reset to the maximum count state, and await the next start pulse ACLK. The 8 bit output from EPROM 60 is coupled to the preset inputs of a ÷ by N counter 62. Counter 62 has a clock input 63 which is supplied with a 15 MHz clock signal from a crystal oscillator source 64. The output of ÷by N counter 62, in the preferred embodiment, is a 6 KHz-7.6 KHz square wave, which is coupled to the input of a first low pass filter 66, the output of which is coupled to a first input of a mixer 67. The other input to mixer 67 is the output of a 9 KHz sine wave source 68. The output of mixer 67 is coupled to the input of a low pass filter 69, which is substantially identical in structure and function to the filter 66. The output of low pass filter 69 is a variable frequency sine wave whose frequency ranges from 1400 Hz to 3000 Hz. The configuration of low pass filters 66, 69 in the preferred embodiment is illustrated in FIG. 10.

Figure 6A:
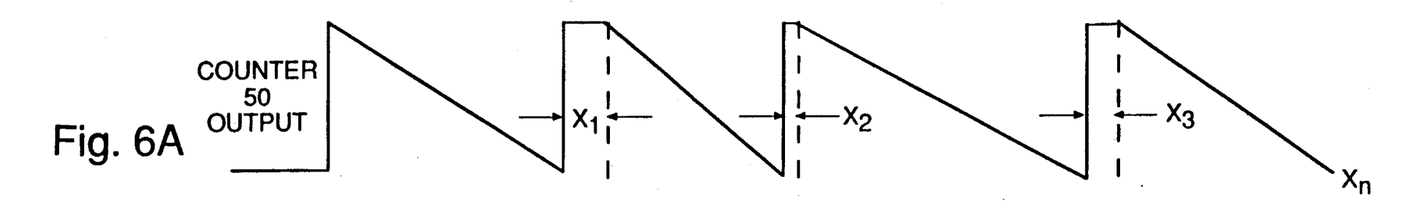
FIGS. 6A-6D are timing diagrams illustrating the modulation carrier signal generation process.
Figures 6B, 6C:
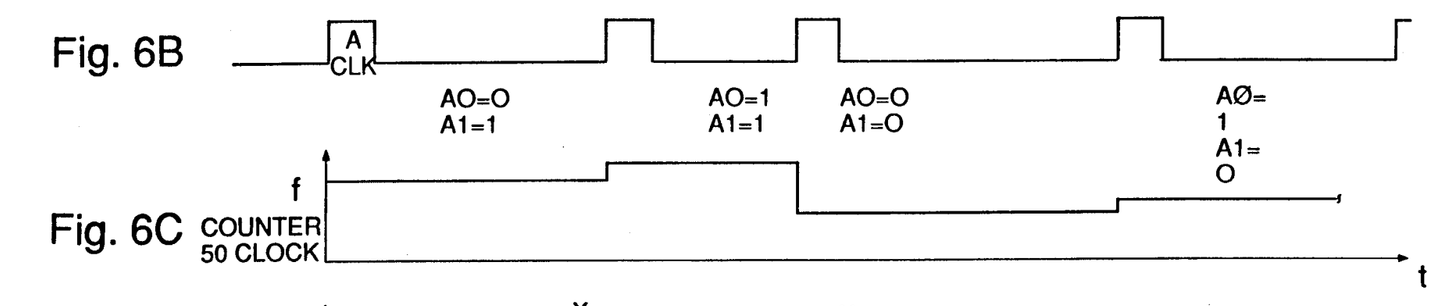

In operation, counter 50 is enabled to begin counting from an initial count by the leading edge of an ACLK signal (FIG. 6B). The rate at which counter 50 is decremented is determined by the clock input on terminal 52 supplied by ÷ by K counter 53. Although the clock input present on input terminal 56 to the ÷ by K counter 53 is a constant frequency (1 MHz) clock signal from source 57, the value of K and thus the frequency of the output clock from K counter 53 is dependent upon the values of A0, A1 on the control input terminals 54, 55. ACLK, A0 and A1 signals are all generated initially at the scrambling site and are conveyed along with the scrambled audio information to the descrambling site. In the video system illustrated in FIGS. 1A and 1B, control signals ACLK, A0 and A1 are all embedded in appropriate portions of the vertical interval of the video signals in any appropriate fashion.

As counter 50 is clocked by the clock signal from by K counter 53, the values stored in EPROM 60 are read out at a rate determined by the rate at which counter 50 is being clocked. In the preferred embodiment, EPROM 60 is completely read within a range of about 1.5 to 10 seconds. For each value output from EPROM 60, the ÷ by N counter 62 generates a square wave at a specific frequency within the range of 6 KHz–7.6 KHz, dependin counter modulus) specified by the output of EPROM 60. The square wave output from counter 62 is smoothed in low pass filter 66 to provide a relatively pure sine wave whose instantaneous frequency is in the range from 6 KHz–7.6 KHz. This signal is mixed in mixer 67 with the 9 KHz source 68, and the output from the mixer 67 is low pass filtered by filter 69 to provide a constant amplitude pure sine wave whose instantaneous frequency lies within the range of 1.4 KHz–3.0 KHz.

The operation of the FIG. 5 circuit is illustrated in FIGS. 6A–6D. In particular, FIG. 6A illustrates the state of the counter 50 output, while FIGS. 6A and 6B show the relationship between the ACLK signal and the start of the decrementing of counter 50. Note that the distance between successive leading edges of the ACLK signal varies in a random or pseudo random fashion and is not constant. Thus, for the first ACLK leading edge, counter 50 commences counting from a maximum count value in a linear fashion down to the minimum value, automatically resets to the maximum count and waits for the leading edge of the next ACLK pulse signal. When this occurs, the counter again commences counting down from the maximum to the minimum value, resets to the maximum state, etc.

The slope of the counter 50 output trace and thus the countdown rate is determined by the value of AO and A1 when counter 50 is started by the leading edge of ACLK signal. The relationship between the four possible A0, A1 values (for the two bit control signal version illustrated) and the output frequency of the ÷ by K counter 53 is illustrated in FIG. 6C. As seen in this FIG., which plots frequency of the counter 50 input clock versus time, the first pair of values of A0=0, A1=1 provides a first count frequency producing the counter 50 countdown slope depicted in the region of FIG. 6A after the leading edge of the first ACLK pulse. Similarly, the second pair of values of A0=1, A1=1 provides a different counter 50 clock frequency (the highest frequency in the example shown) producing the counter 50 countdown slope in the region after the leading edge of the second ACLK pulse. Similarly, A0=0, A1=0 provides the lowest counter 50 clock frequency and the slope depicted in the region after the leading edge of the third ACLK pulse.

Figure 6D:
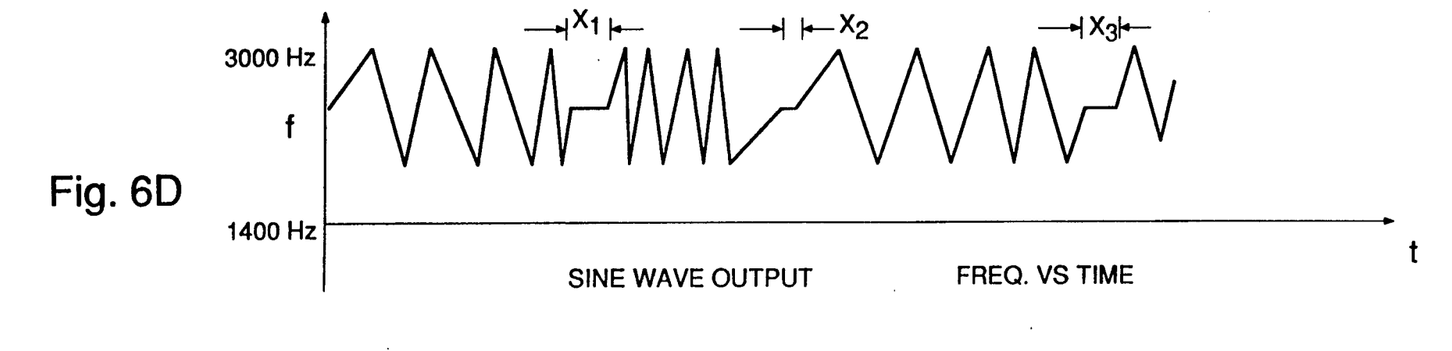
Figure 7:
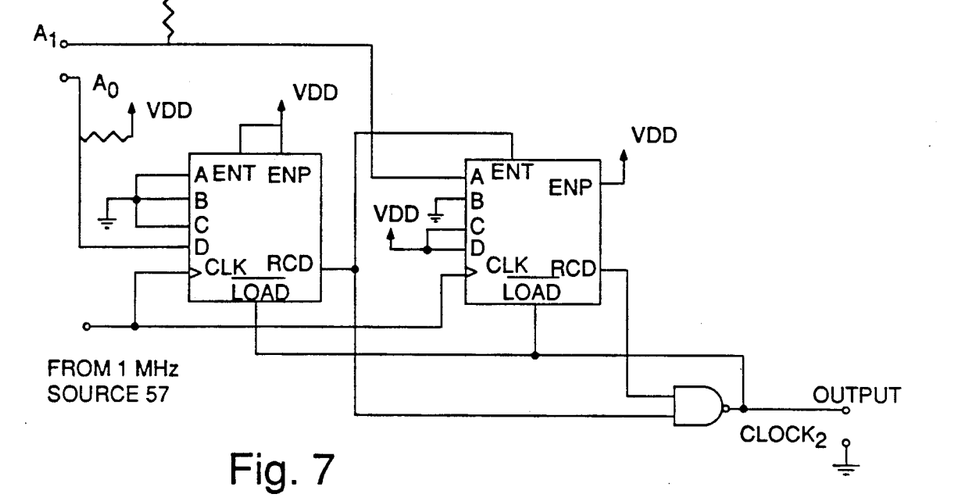
FIG. 7 is a logic diagram illustrating the K counter of the generator of FIG. 5.
Figure 8:
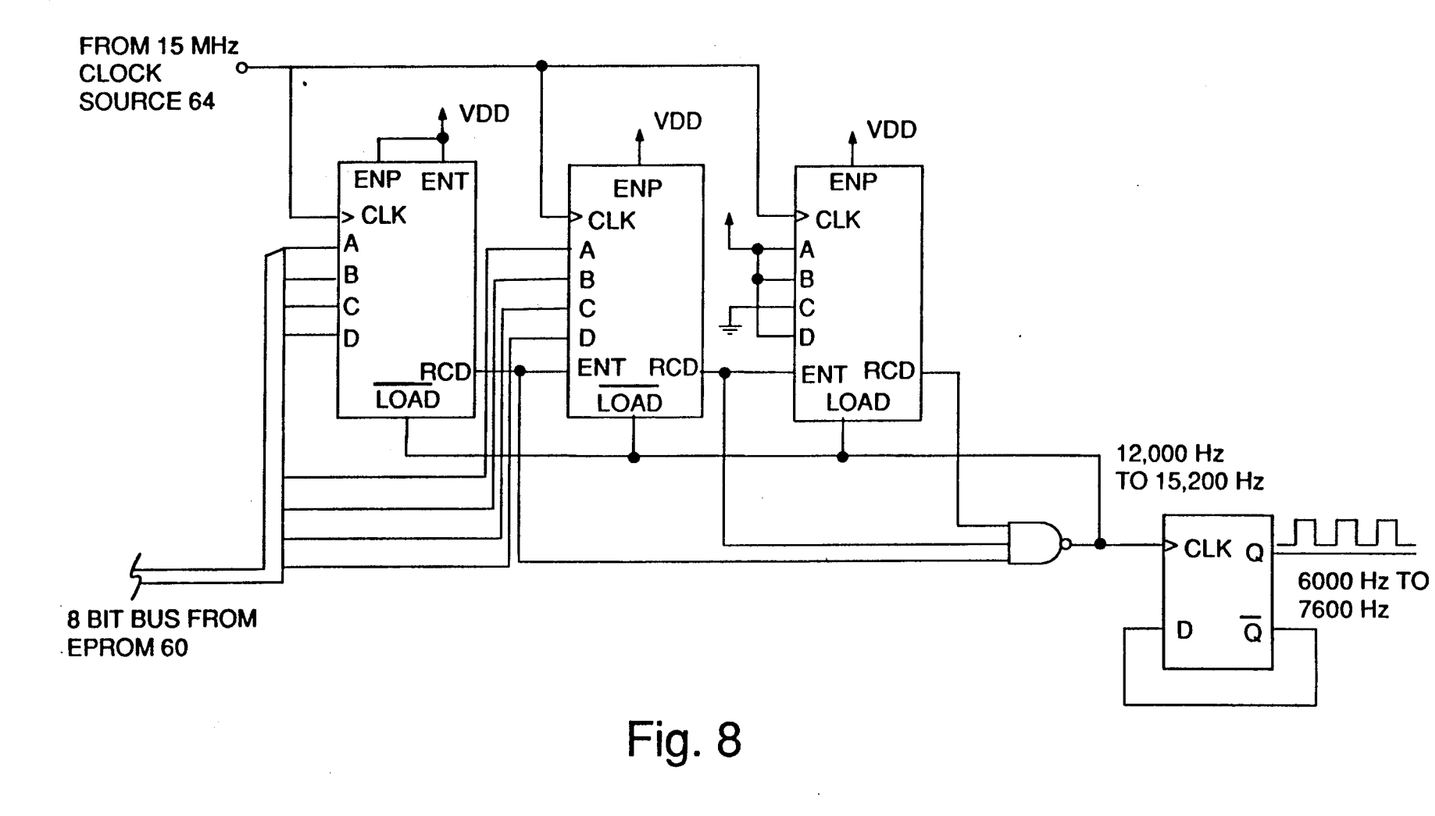
FIG. 8 is a logic diagram illustrating the divide by N counter of the generator of FIG. 5.

FIG. 6D shows the effect on the carrier signal output from low pass filter 69 of the combined ACLK, A0 and A1 signals. During the count period commencing with the leading edge of the first ACLK pulse the frequency of the sine wave output from filter 69 sweeps between the minimum and maximum frequencies (1400 Hz–3000 Hz) at a first linear rate, starting at some initial value determined by the first modulus N output value from EPROM 60. After the counter 50 has counted down to the minimum value and is automatically reset, the output frequency stabilizes at the initial value during interim period designated $X_1$, which is the waiting period between the end of the countdown of counter 50 and the arrival of the leading edge of the next ACLK pulse. Upon arrival of the second ACLK pulse, counter 50 is decremented at the maximum rate (specified by A0=1, A1=1) and the frequency of the sine wave output from filter 69 varies between the limits in a linear fashion swept at a higher frequency. When counter 50 counts down and is reset, the sine wave output remains at the constant mid-value depicted during interim period $X_2$ until the arrival of the leading edge of the next ACLK pulse. The operation continues as already described for each successive appearance of the A0, A1 values and the leading edge of the ACLK pulse.

In the scrambling operation, the ACLK, A0, and A1 signals are all provided to scramble unit 14 from a suitable source. In the FIG. 6A–6D embodiment, the repetition rate of successive ACLK signals is preferably varied in an unpredictable manner, using any known pseudo random counting device; while the values of A0, A1 are also pseudo randomly generated. In addition, the spacing between successive ACLK pulses and the rate values A0, A1 are selected such that counter 50 is permitted to decrement to the minimum value before the start of the next counter 50 cycle, so that the frequency variation is not subject to a sudden discontinuity (which is undesirable). In the descrambling operation, the ACLK, A0, A1 signals must be provided to the descrambler unit 16 along with the scrambled audio signals so that the descrambling modulation carrier signal is generated in such a manner as to match the scrambling modulation carrier signal. This provision of the control signals can be accomplished in any suitable manner known to those skilled in the art. In the example shown in FIGS. 1A and 1B utilizing associated video signals, the ACLK, AO and A1 signals can be inserted into the vertical blanking intervals of selected video fields and detected using conventional detection circuitry.

Other combinations of ACLK, A0 and A1 start and rate signals may be employed. For example, the repetition rate of ACLK may be fixed at some periodic value, and the values of A0, A1 or both may be changed randomly during the time period between successive ACLK pulses. The effect is to vary the clock 2 input on terminal 52 of counter 50 in a pseudo random manner, which causes a similar effect at the output of counter 50. For optimum operation, the relative values of ACLK repetition rate and the rates specified by A0, A1 should be selected so that counter 50 is decremented to the final value (by the clock 2 signal) prior to reset by the succeeding ACLK pulse to avoid a sharp discontinuity in the frequency of the output of counter 62.

FIG. 9 illustrates one stage of a pair of phase shifters providing two constant amplitude phase shifters yielding a pair of net outputs of 0° and 90°. All of the R resistances have the same value. However, the values of $R_1$, $C_1$ and $R_2$, $C_2$ are selected to provide the 90° difference between the two outputs $VOUT_1$ and $VOUT_2$. To increase the range of the upper and lower frequencies, pairs of phase shifter sections illustrated in FIG. 9 are added in cascade to construct phase shifters 21, 26 of the scrambler and descrambler units.

Figure 11:
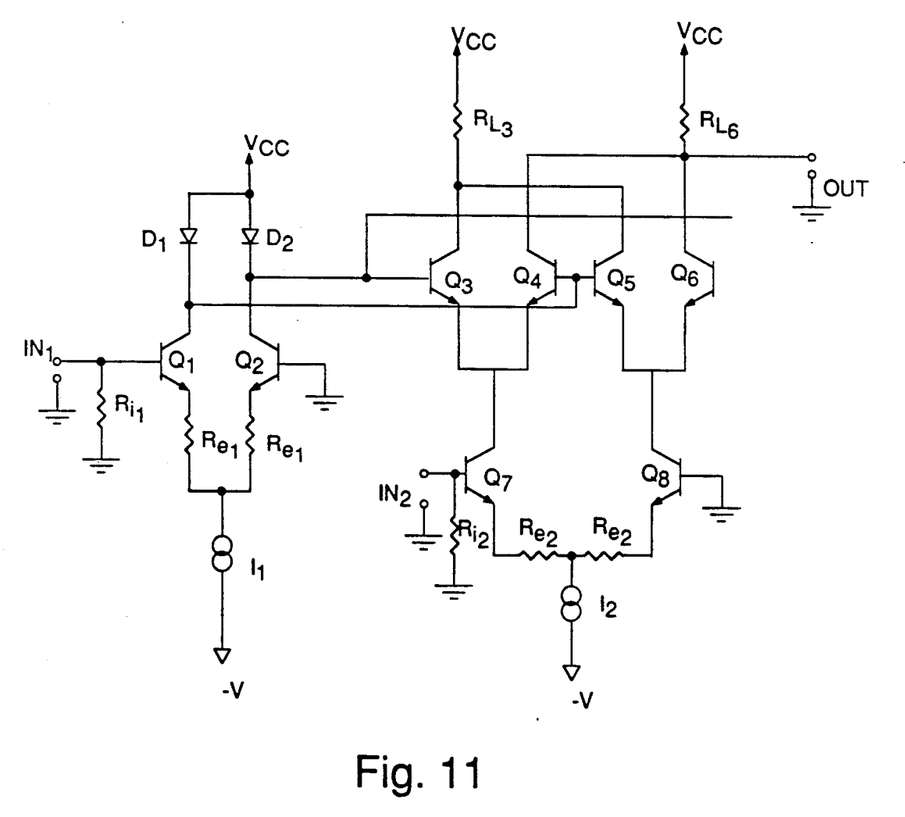
FIG. 11 is a circuit diagram showing the double side band mixer used in the circuitry of FIG. 2.

With reference to FIG. 11, which illustrates mixers 23, 24 of the scrambler and descrambler units, resistances Rel provide local feedback to linearize the $Q_1$ and $Q_2$ collector current versus the input voltage INI at the bases of $Q_1$, $Q_2$. Diodes $D_1$ and $D_2$ predistort the driving voltage into $Q_3$-$Q_6$ such that the transfer function from $IN_1$ to the output voltage at $RL_6$ is linear. Voltage $IN_2$ is linearized for $Q_7$ and $Q_8$ collector current via both resistances $Re_2$. Due to the push/pull arrangement of the collector currents of $Q_7$ and $Q_8$ modulating the amplifier pairs of $Q_3$, $Q_4$ and $Q_5$, $Q_6$, a linear relationship is provided between $IN_2$ and the output signal. In general, the output signal equals $K \times IN_1 \times IN_2$, where K is a constant.

Figure 12:
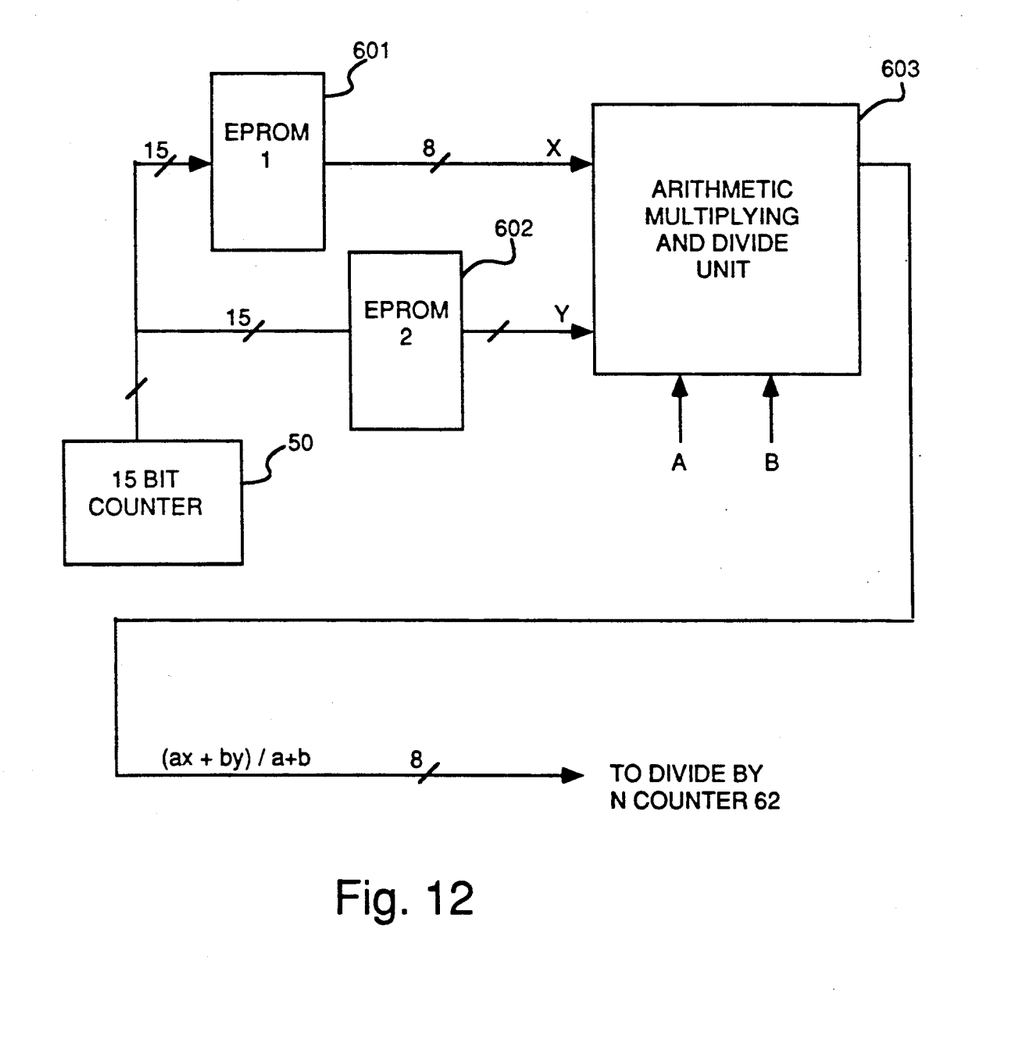
FIG. 12 is a schematic diagram illustrating an alternate embodiment of the modulus generator for the divide by N counter of FIG. 8.

FIG. 12 illustrates an alternate embodiment of the invention which provides enhanced security to the process for generating the modulus N frequency specifying signals for counter 62. As seen in FIG. 12, the single EPROM memory unit 60 is replaced by a pair of EPROM memory units 601, 602, each having multi-bit address input terminals coupled to the output of counter 50. Each EPROM memory unit 601, 602 stores a plurality of 8 bit modulus determining values which are individually addressed by the output of counter 50 and coupled to the paired inputs of an arithmetic logic unit 603. Also coupled to the input of arithmetic logic unit 603 are a pair of numerical values designating a, b, which are multi-bit (i.e., 4 bit) randomly generated numbers. The output of ALU 603 is coupled to the address input of divide by N counter 62. The alternate embodiment shown in FIG. 12 adds enhanced security by generating each modulus specifying value N from a pair of multi-bit (8 bit) values stored in the memory units 601, 602 and the two random numbers a, b, which are used in any desired algorithmic manner. For example, the output from ALU 603 may be simply the linear combination aX+aY, where X and Y are the output values from memory devices 601, 602; similarly, the random numbers a, b may additionally be used as a combinatorial devisor for the values X, Y, or in any other suitable fashion.

As will now be apparent, the invention provides scrambling and descrambling of audio information signals which results in the recovery of the original audio information signals in a faithful manner. The signals are recovered with minimal fluctuations in phase and frequency introduced by the electromechanical recording apparatus used to record and reproduce the signals; and the recovered signals are relatively unaffected (as compared to frequency inversion scrambling) by the limited high frequency head room found in broadcast preemphasis and record equalization systems. At the same time, the audio signals are scrabmled in a very secure fashion by use of the pseudo random varying modulation carrier, while requiring a substantially narrower bandwidth than other audio scrambling techniques, in particular, digital scrambling systems. Further, since the entire scrambling and descrambling signal processing occurs in the analog domain, relatively low distortion is introduced to original audio input signals having a relatively low level, as opposed to digital systems which can completely corrupt low level input signals.

While the above provides a full and complete disclosure of the preferred embodiment of the invention, various modifications, alternate constructions and equivalents will appear to those skilled in the art. For example, while specific frequencies have been illustrated for the modulation carrier signal, other values may be more suitable in a given application. Also, the security afforded by the pseudo random varying modulation carrier frequency may be enhanced by adding passwords, additional control signals supplemental to A0, A1 and other technqiues known to those skilled in the art. Therefore, the above descriptions and illustrations should not be construed as limiting the invention which is defined by the appended claims.

What is claimed is:

1. A system for generating a variable frequency sine wave carrier signal in response to a start signal and a rate signal, said carrier signal having frequencies lying within a predetermined spectral frequency limit, said system comprising:

first settable counter means having a clock input for receiving a first clock signal, a count input for receiving modulus value signals for establishing the counter modulus N, and an output terminal for manifesting a binary output signal having a frequency determined by the modulus N and said first clock signal;

modulus generating means having a control input for receiving said start signal, a clock input for receiving a second clock signal, wherein said start signal and said second clock signal have varying rates with respect to each other so that an output coupled from said modulus generating means to said count input of said first settable counter means generates a succession of different modulus values at said first settable counter means, said first settable counter means thereby generating binary output signals of varying frequency and means having an input coupled to the output terminal of said first settable counter means for converting the binary output signals therefrom to analog sine signals of variable frequency.

2. The system of claim 1 wherein said modulus generating means includes a second counter means having an input serving as said clock input of said modulus generating means and an output, and memory means for storing said modulus values, said memory means having address inputs coupled to the output of said second counter means.

3. The system of claim 1 further including a second clock generating means, said second clock generating means including an oscillator and a second settable counter means having a clock input coupled to said oscillator, a count input terminal means for receiving said rate signal, and an output terminal means coupled to said clock input of said modulus generating means, the output of said second settable counter means having a frequeωcy determined by the value of said rate signal.

4. The system of claim 3 wherein said rate signal is non-periodic.

5. The system of claim 3 wherein said rate signal is pseudo random.

6. The system of claim 1 wherein said modulus generating means includes second counter means having an input serving as said clock input of said modulus generating means and said output, first memory means for storing a first plurality of modulus determining values, second memory means for storing a second plurality of modulus determining values, said first and second memory means having address inputs coupled to the output of said second counter means and outputs, and processing means having inputs coupled to said outputs of said first and second memory means for generating said modulus values from said modulus determining values.

7. The system of claim 1 wherein said converting means includes: a first low pass filter means for smoothing the binary output signals from said first settable counter means; means for generating a sine wave signal having a frequency different from the frequency of the signals output from said first low pass filter means; mixer means having a first input coupled to the output of said of said sine wave signal generating means, and an output; and second low pass filter means having an input coupled to the output of said mixer means and an output for passing signals having frequencies lying within said predetermined spectral frequency limit.

8. A system for generating a variable frequency sine wave carrier signal in response to a start signal and a rate signal, said carrier signal having frequencies lying within a predetermined spectral frequency limit, said system comprising:

first settable counter means having a clock input for receiving a first clock signal, a count input for receiving modulus value signals for establishing the counter modulus N, and an output terminal for manifesting a binary output signal having a frequency determined by the modulus N and said first clock signal;

modulus generating means having a control input for receiving said start signal, a clock input for receiving a second clock signal, and an output coupled to said count input of said first settable counter means for generating a succession of modulus values in response to receipt of a start signal and said second clock signal; and means having an input coupled to the output terminal of said first settable counter means for converting the binary output signals therefrom to analog sine signals of variable frequency;

wherein said modulus generating means includes a second counter means having an input serving as said clock input of said modulus generating means and an output, and memory means for storing said modulus values, said memory means having address inputs coupled to the output of said second counter means.

9. A system for generating a variable frequency sine wave carrier signal in response to a start signal and a rate signal, said carrier signal having frequencies lying within a predetermined spectral frequency limit, said system comprising:

first settable counter means having a clock input for receiving a first clock signal, a count input for receiving modulus value signals for establishing the counter modulus N, and an output terminal for manifesting a binary output signal having a frequency determined by the modulus N and said first clock signal;

modulus generating means having a control input for receiving said start signal, a clock input for receiving a second clock signal, and an output coupled to said count input of said first settable counter means for generating a succession of modulus values in response to receipt of a start signal and said second clock signal; and means having an input coupled to the output terminal of said first settable counter means for converting the binary output signals therefrom to analog sine signals of variable frequency;

second clock generating means, said second clock generating means including an oscillator and a second settable counter means having a clock input coupled to said oscillator, a count input terminal means for receiving said rate signal, and an output terminal means coupled to said clock input of said modulus generating means, the output of said second settable counter means having a frequency determined by the value of said rate signal.

10. A system for generating a variable frequency sine wave carrier signal in response to a start signal and a rate signal, said carrier signal having frequencies lying within a predetermined spectral frequency limit, said system comprising:

first settable counter means having a clock input for receiving a first clock signal, a count input for receiving modulus value signals for establishing the counter modulus N, and an output terminal for manifesting a binary output signal having a frequency determined by the modulus N and said first clock signal;

modulus generating means having a control input for receiving said start signal, a clock input for receiving a second clock signal, and an output coupled to said count input of said first settable counter means for generating a succession of modulus values in response to receipt of a start signal and said second clock signal; and means having an input coupled to the output terminal of said first settable counter means for converting the binary output signals therefrom to analog sine signals of variable frequency;

wherein said modulus generating means includes second counter means having an input serving as said clock input of said modulus generating means and said output, first memory means for storing a first plurality of modulus determining values, second memory means for storing a second plurality of modulus determining values, said first and second memory means having address inputs coupled to the output of said second counter means and outputs, and processing means having inputs coupled tosaid outputs of said first and second memory means for generating said modulus values from said modulus determining values.

11. A system for generating a variable frequency sine wave carrier signal in response to a start signal and a rate signal, said carrier signal having frequencies lying within a predetermined spectral frequency limit, said system comprising:

first settable counter means having a clock input for receiving a first clock signal, a count input for receiving modulus value signals for establishing the counter modulus N, and an output terminal for manifesting a binary output signal having a frequency determined by the modulus N and said first clock signal;

modulus generating means having a control input for receiving said start signal, a clock input for receiving a second clock signal, and an output coupled to said count input of said first settable counter means for generating a succession of modulus values in response to receipt of a start signal and said second clock signal; and means having an input coupled to the output terminal of said first settable counter means for converting the binary output signals therefrom to analog sine signals of variable frequency;

wherein said converting means includes: a first low pass filter means for smoothing the binary output signals from said first settable counter means; means for generating a sine wave signal having a frequency different from the frequency of the signals output from said first low pass filter means; mixer means having a first input coupled to the output of said first low pass filter means, a second input coupled to the output of said sine wave signal generating means, and an output; and second low pass filter means having an input coupled to the output of said mixer means and an outlet for passing signals having frequencies lying within said predetermined spectral frequency limit.

* * * * *

UNITED STATES PATENT AND TRADEMARK OFFICE
CERTIFICATE OF CORRECTION

PATENT NO.    :   5,095,279
DATED         :   March 10, 1992
INVENTOR(S)   :   Quan, et al.

It is certified that error appears in the above-identified patent and that said Letters Patent is hereby corrected as shown below:

Col. 7, line 19, before "K" insert -- ÷ --.

Col. 9, line 1, delete "All" and insert -- All --.

Col. 9, line 11, delete "Re1" and insert -- $Re_1$ --.

Col. 9, line 12, delete "INI" and insert -- $IN_1$ --.

Col. 9, line 61, delete "scrabmled" and insert -- scrambled --.

Col. 10, line 60, (Claim 3), delete "frequwcy" and insert -- frequency --.

Col. 11, line 16 (Claim 7), after "said" insert -- first low pass filter means, a second input coupled to the output --.

UNITED STATES PATENT AND TRADEMARK OFFICE
CERTIFICATE OF CORRECTION

PATENT NO. : 5,095,279

DATED : March 10, 1992

INVENTOR(S) : Quan, et al

It is certified that error appears in the above-identified patent and that said Letters Patent is hereby corrected as shown below:

Col. 12, line 50 (Claim 10), delete "tosaid" and insert -- to said --.

Signed and Sealed this

Thirteenth Day of July, 1993

Attest:

MICHAEL K. KIRK

*Attesting Officer*     Acting Commissioner of Patents and Trademarks